United States Patent
Kanbe

(10) Patent No.: US 7,932,574 B2
(45) Date of Patent: Apr. 26, 2011

(54) SOLID-STATE IMAGING DEVICE

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 1075 days.

(21) Appl. No.: 10/838,626

(22) Filed: May 4, 2004

(65) Prior Publication Data

US 2004/0259010 A1 Dec. 23, 2004

(30) Foreign Application Priority Data

May 6, 2003 (JP) .................. 2003-127673

(51) Int. Cl.
*H01L 33/40* (2010.01)
(52) U.S. Cl. ....................... 257/431; 257/440
(58) Field of Classification Search .......... 257/431, 257/440
See application file for complete search history.

(56) References Cited

U.S. PATENT DOCUMENTS

| | | | | |
|---|---|---|---|---|
| 4,942,531 | A * | 7/1990 | Hainsworth et al. | 701/23 |
| 5,155,348 | A * | 10/1992 | Ballingal et al. | 250/208.1 |
| 6,841,816 | B2 * | 1/2005 | Merrill et al. | 257/294 |

FOREIGN PATENT DOCUMENTS

| | | |
|---|---|---|
| JP | 61-093678 | 5/1986 |
| JP | 63-014482 | 1/1988 |
| JP | 64-077182 | 3/1989 |
| JP | 2002-083946 | 3/2002 |

OTHER PUBLICATIONS

Dietmar Knipp, Patrick G. Herzog, and Helmut Stiebig, Stacked Amorphous Silicon Color Sensors, IEEE Transactions on Electron Devices, vol. 49, No. 1, Jan. 2002.*

* cited by examiner

*Primary Examiner* — Michael B Shingleton
(74) *Attorney, Agent, or Firm* — Robert J. Depke; Rockey, Depke & Lyons, LLC

(57) ABSTRACT

A solid-state imaging device having a light receiving section comprised of a stack of a photoconductive layer for absorbing light in a wavelength region for red, a photoconductive layer for absorbing light in a wavelength region for green, and a photoconductive layer for absorbing light in a wavelength region for blue. A transparent electrode layer is provided preferably above each of the photoconductive layers and a translucent reflective layer for reflecting light in a desired wavelength is provided.

20 Claims, 4 Drawing Sheets

THE PRESENT INVENTION

PRIOR ART (SIMPLE THREE-LAYER)

SOLID-STATE IMAGING DEVICE

BACKGROUND OF THE INVENTION

1. Field of the Invention

The present invention relates to single-plate color CCD and CMOS solid-state imaging devices and, more specifically, to a solid-state imaging device of a photoconductive-layer-stacked type, including a stack of photoconductive layers serving as an optical-electrical conversion section on a substrate.

2. Description of the Related Art

In a single-plate color solid-state imaging device of a general type, color filters such as R (Red), G (Green), and B (Blue) are assigned to a pixel formed with a light receiving section. With the solid-state imaging device structured as such, the pixels each assigned with various color filters are put in groups to derive a color signal. This results in limited improvement of the spatial resolution. For betterment, recently proposed is a solid-state imaging device including a stack of photoconductive layers (optical-electrical conversion layers) serving as an optical-electrical conversion section with a one-to-one relationship between layers and colors. With such a solid-state imaging device, a color signal can be derived without grouping pixels but with a single pixel.

In the solid-state imaging device of such a photoconductive-layer-stacked type wherein the photoconductive layer to be the optical-electrical conversion section is formed on the substrate, FIG. 1 shows the structure of a light receiving section. Referring to FIG. 1, the light-receiving section is located on a semiconductor substrate 101, and structured by photoconductive layers 103R for red, 103G for green, and 103B for blue. On these photoconductive layers 103R, 103G, and 103B, a transparent electrode 105 is each provided. To be more specific, the photoconductive layer 103B is located at the top with a thickness enough to absorb light Hb in a wavelength region specifically for blue. The photoconductive layer 103G is located at the middle with a thickness enough to absorb light Hg in a wavelength region specifically for green. Located at the bottom is the photoconductive layer 103R with a thickness enough to absorb light Hr in a wavelength region specifically for red.

Through voltage application to the semiconductor substrate 101, and the transparent electrode layers 105 placed above and below of these photoconductive layers 103R, 103G, and 103B, any electric charge absorbed through these photoconductive layers 103R, 103G, and 103B is successively read after optical-electrical conversion. In such a manner, a color signal can be derived by a single pixel (for details, refer to Non-Patent Document 1 below).

[Non-Patent Document 1]

Dietmar Knipp, et al. "Stacked Amorphous Silicon Color Sensor", IEEE TRANSACTION ON ELECTRON DEVICES, VOL. 49, NO. 1, JANUARY 2002, P. 170 to 176.

SUMMARY OF THE INVENTION

The issue here is that, in the above solid-state imaging device of a photoconductive-layer-stacked type, it is difficult for the photoconductive layers to completely absorb the light in the respective wavelength regions. As a result, as shown in FIG. 1, if the photoconductive layer 103B at the top fails to completely absorb the light Hb in the blue wavelength region, the remaining light leaks into the photoconductive layers 103G and 103R therebelow. Similarly, if the photoconductive layer 103G in the middle fails to completely absorb the light Hg in the green wavelength region, light leakage into the lower photoconductive layer 103R cannot be completely prevented. Such light leakage resultantly reduces both the color resolution and any target signal strength, i.e., sensitivity, in the wavelength regions of the photoconductive layers 103R, 103G, and 103B.

Therefore, an object of the present invention is to provide a single-plate color solid-state imaging device of a photoconductive-layer-stacked type achieving the higher color resolution and the better sensitivity.

In order to achieve the above object, the present invention is directed to a solid-state imaging device in which a substrate corresponding to a pixel is carrying thereon a light receiving section that is a stack of multilayer films, each including a photoconductive layer and a transparent electrode layer thereon. In the imaging device, the transparent electrode layers placed between the photoconductive layers are sandwiching a translucent reflective layer with which light in a predetermined wavelength region is reflected but light of a wavelength longer than that is passed through.

Further, the present invention is also directed to a solid-state imaging device including: a first optical-electrical conversion layer; a second optical-electrical conversion layer formed above the first optical-electrical conversion layer; and a third optical-electrical conversion layer formed above the second optical-electrical conversion layer. In the imaging device, a first translucent layer is formed between the first optical-electrical conversion layer and the second optical-electrical conversion layer, and a second translucent layer is formed between the second optical-electrical conversion layer and the third optical-electrical conversion layer.

DETAILED DESCRIPTION OF THE INVENTION

Description of the Preferred Embodiment

In the below, a solid-state imaging device of an embodiment of the present invention is described in detail by referring to the accompanying drawings.

Figure 2:
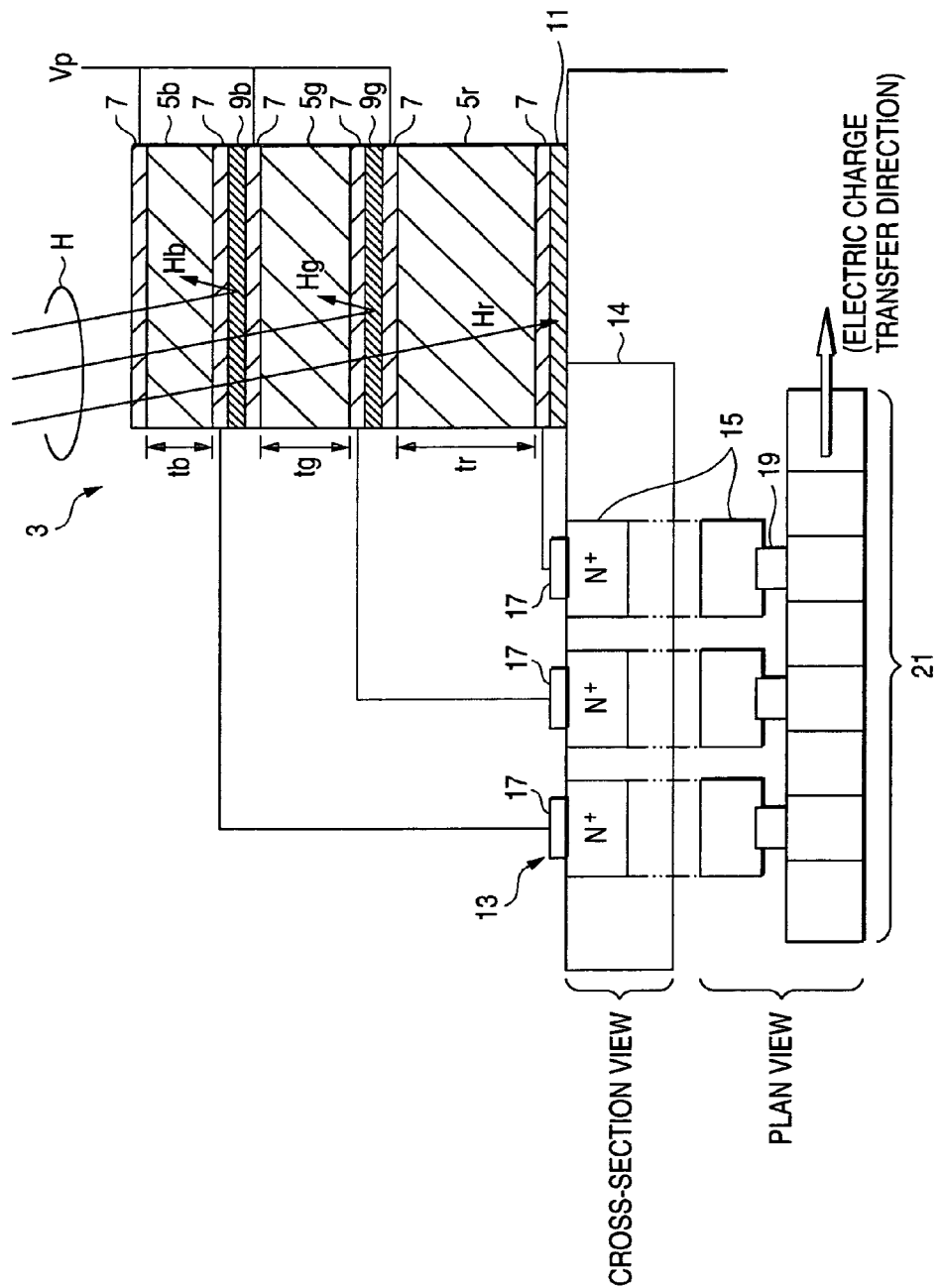
FIG. 2 is a diagram showing the structure of a solid-state imaging device of an embodiment.

FIG. 2 is a diagram showing the main structure of an exemplary solid-state imaging device having applied with the present invention. In the drawing, the solid-state imaging device includes a substrate 1 exemplarily made of single-crystal silicon, and on the surface thereof, a plurality of pixels are arranged in matrix (in the drawing, only one pixel is shown). On each of the pixels, a light receiving section 3 is provided.

The light receiving section 3 includes a photoconductive layer 5r for red, a photoconductive layer 5g for green, and a photoconductive layer 5b for blue, those of which are stacked in this order on the substrate 1. A transparent electrode layer 7 is provided above and below of each of these photoconductive layers 5r, 5g, and 5b. That is, the photoconductive layer 5r is sandwiched between the transparent electrode layers 7, and so are the photoconductive layers 5g and 5b. The transparent electrode layer 7 above the photoconductive layer 5r and the transparent electrode layer 7 below the photoconductive layer 5g are sandwiching a translucent reflective layer 9g for reflecting light in any specific wavelength region. For the same purpose, a translucent reflective layer 9b is sandwiched between the transparent electrode layer 7 above the photoconductive layer 5g and the transparent electrode layer 7 below the photoconductive layer 5b. As such, the structure is a two-layer structure in which the electrode layers 7 placed between the photoconductive layers 5r, 5g, and 5b are sandwiching the translucent reflective layers 9g and 9b. Further, between the substrate 1 and the transparent electrode layer 7 at the bottom (i.e., lowermost transparent electrode layer), a light absorbing layer 11 is placed.

Described in detail next are the respective layers structuring the above light receiving section 3.

Although not shown, the photoconductive layers 5r, 5g, and 5b are each a multilayer film. In the multilayer film, an optical-electrical conversion layer is sandwiched between an electronic injection block layer and a hole injection block layer. The photoconductive layers 5r, 5g, and 5b in such a multilayer structure are each has, for example, an optical-electrical conversion layer made of i-type amorphous silicon that is sandwiched by an electronic injection block layer made of i-type amorphous silicon carbide, and a hole injection block layer made of p-type amorphous silicon carbide.

As to light H entering from the transparent electrode layer 7 at the top, the photoconductive layer 5b placed therebelow has a thickness tb of absorbing light Hb in a wavelength region for blue and the light Hb of a wavelength shorter than that, but passing though light of a wavelength region longer than the blue wavelength region. As to the light H reaching the photoconductive layer 5g in the middle from the transparent electrode layer 7 at the top, the photoconductive layer 5g has a thickness tg of absorbing light Hg in a wavelength region for green, but passing though light of a wavelength region longer than the green wavelength region. Further, the photoconductive layer 5r at the bottom has a thickness tr of absorbing light reaching from the transparent electrode layer 7 at the top, i.e., light Hr in a wavelength region for red that is a longer wavelength region than the green wavelength region.

Herein, such layer thicknesses tb, tg, and tr all denote an optical film thickness showing a change depending on the material of the corresponding photoconductive layers 5r, 5g, and 5b.

The transparent electrode layers 7 sandwiching these photoconductive layers 5r, 5g, and 5b are made of, for example, ITO (Indium Tin Oxide), TO (Tin Oxide), PET (polyethylene terephthalate), IZO (Indium Zinc Oxide), IXO (compound of indium, zinc, and oxygen), or others.

The translucent reflective layer 9g sandwiched between the transparent electrode layer 7 above the photoconductive layer 5r and the transparent electrode layer 7 below the photoconductive layer 5g, and the translucent reflective layer 9b sandwiched between the transparent electrode layer 7 above the photoconductive layer 5g and the transparent electrode layer 7 below the photoconductive layer 5b are exemplified by a so-called Dichroic mirror or Dichroic filter with properties of translucency and half-reflection. Specifically, the translucent reflective layers 9g and 9b are so structured as to reflect any light in a predetermined wavelength region, but to pass through any light on a longer wavelength side. Through utilization of light interference effect of a multilayer film, such translucent reflective layers 9g and 9b are to reflect only light in a predetermined wavelength region and pass through light in any other wavelength regions.

Figure 3A:
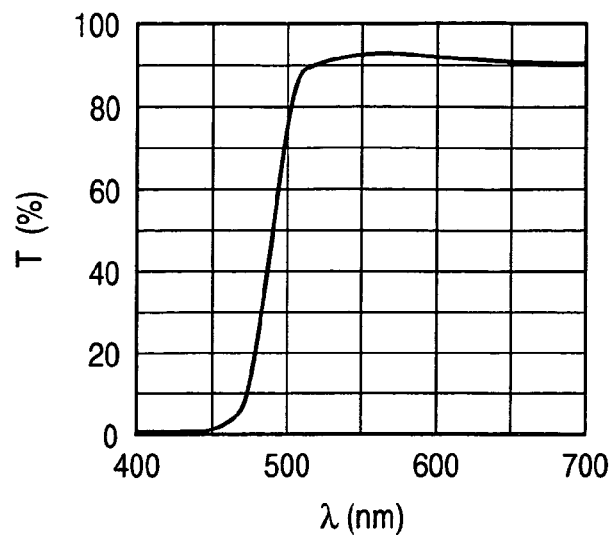
FIGS. 3A to 3C are all a graph showing the light transmission properties of a translucent reflective layer and a light absorbing layer.

Specifically, the upper translucent reflective layer 9b reflects, out of the light H entering the photoconductive layer 5b from the transparent electrode layer 7 at the top, only the light Hb in the blue wavelength region that is supposed to be absorbed by the photoconductive layer 5b therebelow, and passes through the light H in a longer wavelength region. That is, as shown in FIG. 3A, the translucent reflective layer 9b has a lower transmittance T(%) for the light Hb in the blue wavelength region (about 490 nm to 550 nm), and through reflection of the light Hb in the wavelength region, has a higher transmittance T(%) for the light of a wavelength region longer than that.

Figure 3B:
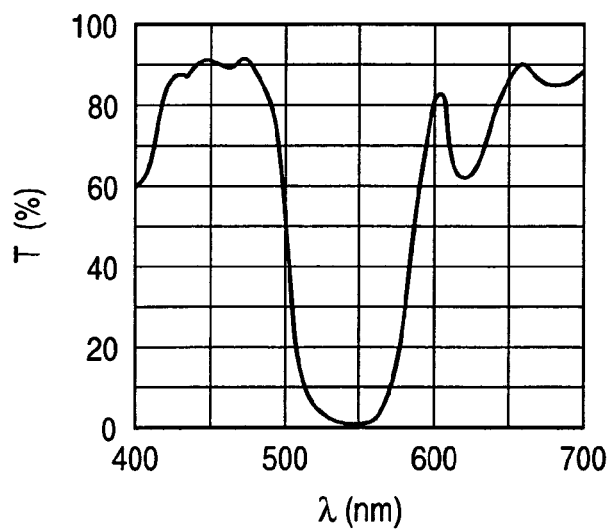

The lower translucent reflective layer 9g reflects, out of the light H reaching the photoconductive layer 5g from the transparent electrode layer 7 at the top, only the light Hg in the green wavelength region that is supposed to be absorbed by the photoconductive layer 5g thereabove, and passes through the remaining light. That is, as shown in FIG. 3B, the translucent reflective layer 9g has a lower transmittance T (%) for the light Hg in the green wavelength region (about 490 nm to 580 nm), and through reflection of the light Hg in the wavelength region, has a higher transmittance T(%) for light of any other wavelength regions.

Figure 3C:
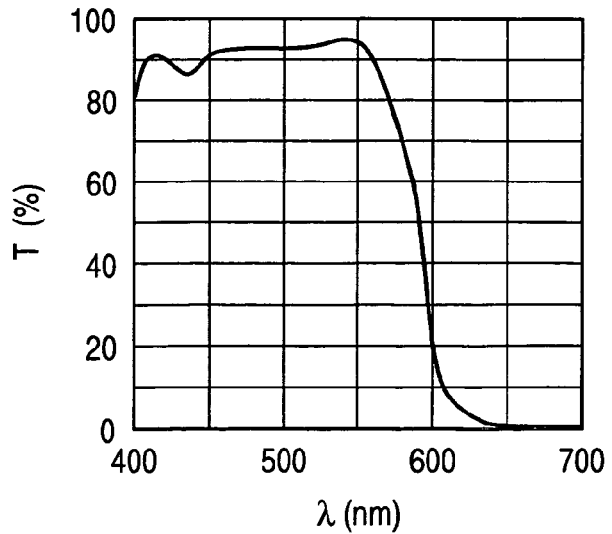

The light absorbing layer 11 locating directly above the substrate 1, i.e., at the bottom of the light receiving section 3, is made of a material capable of absorbing the light entered from the transparent electrode layer 7 at the top. Herein, the light Hr reaching the light absorbing layer 11 is the one having passed through the photoconductive layers 5b, 5g, and 5r. The light Hb in the blue wavelength region is absorbed by the photoconductive layer 5b, and the light Hg in the green wavelength region is absorbed by the photoconductive layer 5g. Accordingly, the light absorbing layer 11 may serve well as long as absorbing the light Hr in the red wavelength region that is supposed to be absorbed by the photoconductive layer 5r. Thus, as shown in FIG. 3C, the light absorbing layer 11 may be a translucent reflective layer with a lower transmittance T(%) for the red light Hr in a longer wavelength region (about 600 nm or more), and through reflection of the light Hr of this wavelength region, has a higher transmittance T(%) for light of a wavelength region shorter than that.

As shown in FIG. 2, to the light receiving section 3 structured as such, capacitors 13 respectively corresponding to the photoconductive layers 5r, 5g, and 5b are connected. As shown in the drawing, the capacitor 13 is an $N^+$ diffusion layer 15 patterned on the surface of a p-well diffusion layer 14 formed on the surface side of the substrate 1. To each of such $N^+$ diffusion layers 15, connected is an extraction electrode 17 pulled out from one of the two translucent electrode layers 7 (the lower transparent electrode layer 7 in the drawing) sandwiching the photoconductive layers 5r, 5g, and 5b, respectively.

The remaining translucent electrode layers 7 (the upper translucent electrode layer 7 in the drawing) not connected to the extraction electrodes 17 are connected to a shared power supply Vp. With such a structure, photocurrent flowing between the translucent electrode layers 7 sandwiching the photoconductive layers 5r, 5g, and 5b, respectively, is extracted as a light receiving signal by the corresponding capacitor 13 for storage.

On the surface of the substrate 1, between the $N^+$ diffusion layer 15 and the surface of the substrate 1, placed is another diffusion layer serving as an electric charge transfer region (not shown) with an interval d serving as a channel region. The upper part of the channel region of the substrate 1 is provided with a reading gate 19 correspondingly to the respective N+ diffusion layers 15. Above the electric charge transfer region, a transfer electrode 21 is placed so that a solid-state imaging device is structured. Herein, the transfer electrode 21 is connected to the reading gate 19 via an insulation layer that is not shown. The resulting solid-state imaging device is a single-plate color CCD solid-state imaging device of a photoconductive-layer-stacked type.

With such a solid-state imaging device, when the light H enters from the uppermost transparent electrode layer 7 to the light receiving section 3 derived by stacking the photoconductive layers 5r, 5g, and 5b, light absorption is observed through the photoconductive layers 5r, 5g, and 5b in ascending order of wavelength, from shorter wavelength region to longer, for optical-electrical conversion. In this case, the uppermost photoconductive layer 5b has the thickness tb of absorbing the light Hb in the blue wavelength region. Thus, out of the light H entered from the transparent electrode layer 7 at the top, the light Hb in the blue wavelength region is absorbed by the photoconductive layer 5b at the top. What is more, thanks to the translucent reflective layer 9b provided beneath the photoconductive layer 5b for reflecting only the light Hb in the blue wavelength region; the light Hb not completely absorbed by the photoconductive layer 5b is reflected by the translucent reflective layer 9b, and then enters again into the photoconductive layer 5b for absorption thereby.

Compared with the case where no such translucent reflective layer 9b is provided, the photoconductive layer 5b shows the better absorption efficiency for the light Hb in the blue wavelength region. Moreover, even if not completely absorbed by the photoconductive layer 5b, the remaining light Hb in the blue wavelength region does not leak into the photoconductive layers 5g and 5r located therebelow. Accordingly, the light Hb of the blue wavelength region can be separated by color with reliability.

The photoconductive layer 5g located below the photoconductive layer 5b receives only the light except for the light Hb in the blue wavelength region. This photoconductive layer 5g has the thickness tg of absorbing the light Hg in the green wavelength region. Thus, out of the light H entering thereinto, the light Hg in the green wavelength region is absorbed by the photoconductive layer 5g. What is more, thanks to the translucent reflective layer 9g provided beneath the photoconductive layer 5g for reflecting only the light Hg in the green wavelength region, even if not completely absorbed by the photoconductive layer 5g, the remaining light Hg in the green wavelength region is reflected by the translucent reflective layer 9g, and then enters again into the photoconductive layer 5g for absorption thereby.

Compared with the case where no such translucent reflective layer 9g is provided, the photoconductive layer 5g shows the better absorption efficiency for the light Hg in the green wavelength region. Moreover, even if not completely absorbed by the photoconductive layer 5g, the remaining light Hg in the green wavelength region does not leak into the photoconductive layer 5r located therebelow. Accordingly, the light Hg in the green wavelength region can be separated by color, with reliability, from the light including no light Hb in the blue wavelength region.

With such a structure, the lowermost photoconductive layer 5r receives only the light not including the lights Hb and Hg in the blue and green wavelength regions as a reliable result of color separation, i.e., the light Hr in the red wavelength region and the light in a longer wavelength region. The lowermost photoconductive layer 5r has the thickness of absorbing the light Hr in the red wavelength region, and the light absorbing layer 11 is provided therebelow for absorbing the light Hr in the red wavelength region. Accordingly, even if not completely absorbed by the photoconductive layer 5g, the light Hr in the red wavelength region does not leak into the upper photoconductive layers 5g and 5b due to reflection.

As such, compared with the case where no such light absorbing layer 11 is provided, the light Hr in the red wavelength region after color separation is successfully prevented from leaking again into the upper photoconductive layers 5g and 5b due to reflection.

Figure 4A:
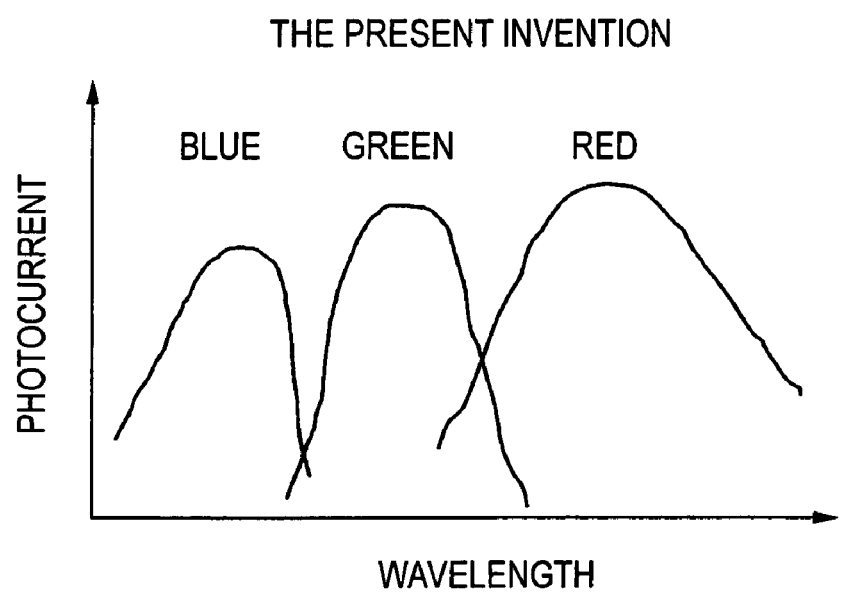
FIGS. 4A and 4B are both a graph of the wavelength-photocurrent relationship showing the spectral properties of the solid-state imaging device.

Thanks to such successful prevention of light leakage among the photoconductive layers 5r, 5g, and 5b as described above, as in FIG. 4A of the graph showing the spectral properties, the photocurrents extracted from the photoconductive layers (blue, green, and red) are all narrowed down in half-value breadth of the wavelength peak. This resultantly improves the color separation properties in the photoconductive layers. Therefore, by regarding these photocurrents as light receiving signals, the resulting images can have the better color reproductivity.

Figure 1:
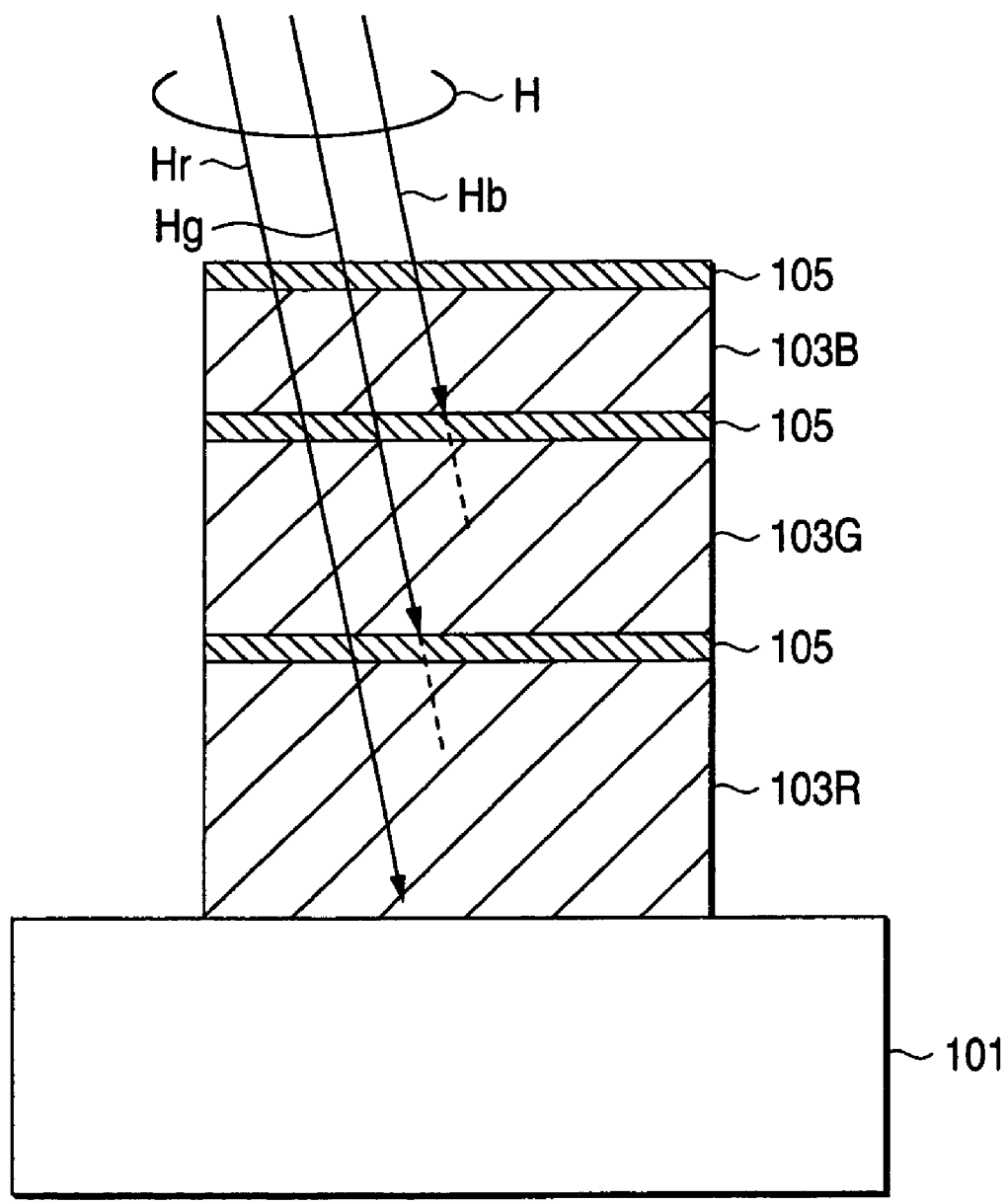
FIG. 1 is a cross-sectional view of a light receiving section in a conventional single-plate color solid-state imaging device of a photoconductive-layer-stacked type.
Figure 4B:
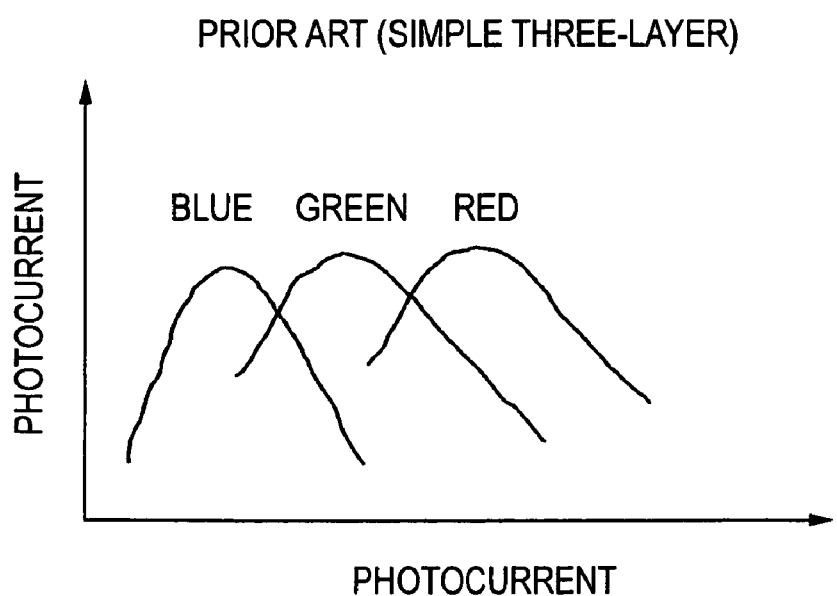

On the other hand, in the conventional solid-state imaging device with the light receiving section of FIG. 1 not including the translucent reflective layers 9g and 9b, nor the light absorbing layer 11, the light in the wavelength region that is supposed to be absorbed by the upper photoconductive layer leaks into the lower photoconductive layer. As a result, as in FIG. 4B of the graph showing the spectral properties, the photocurrents extracted from the photoconductive layers (blue, green, and red) all show a gentle slope to reach their wavelength peaks. This is the reason why the color separation properties have been poor in the photoconductive layers.

Further, with the solid-state imaging device of the present embodiment, as described in the foregoing, any light reflected by the translucent reflective layers 9g and 9b locating below the photoconductive layers 5g and 5b also serve better for optical-electrical conversion. Therefore, compared with the conventional structure including neither the translucent reflective layer 9g nor 9b, the sensitivity can be favorably improved. With the better sensitivity as such, even if the photoconductive layers 5g and 5b are reduced in layer thickness, the sensitivity properties can be easily derived, leading to expectation of the thinner light receiving section.

Still further, with such a structure that the photoconductive layers 5r, 5g, and 5b are each sandwiched by the transparent electrode layers 7. Accordingly, the photoconductive layers 5r, 5g, and 5b can be so driven as to read electric charge to the corresponding capacitor 13 at the same time.

In the below, described now is how to achieve the better color separation properties and sensitivity in the solid-state imaging device of FIG. 2 using a simple model.

Assuming here is that the photoconductive layers 5r, 5g, and 5b structuring the light receiving section 3 are all made of the same material (light absorption coefficient α). The photoconductive layers 5r, 5g, and 5b presumably have, respectively, the thickness of tr, tg, and tb, and the transparent electrode layers 7 are approximated that no light absorption nor reflection is observed. The strength of the light H entered the light receiving section 3 is presumed as to be Io. With such assumptions, the generation rate of electric charge e of the light H at the position with a distance (depth) x from the surface of the light receiving section 3 is expressed as follows:

$g(X) = Io\lambda/hc \times \alpha \times \exp(-\alpha x)$ (where $h$ denotes the Planck's constant, and $c$ denotes the speed of light).

In the conventional structure, the current J flowing through the blue photoconductive layer 5b located away from the surface (distance 0) by tb is expressed as follows:

$$J1 = -q \cdot INT[g(X)] = -qIo\lambda/hc \cdot (1-\exp(-\alpha x))  \quad (1).$$

Herein, INT denotes an integral of an interval from 0 to tb.

In the structure of the present invention, on the other hand, the current J is so approximated that the translucent reflective layer 9b placed between the blue and green photoconductive layers 5b and 5g reflects 100% the light Hb in the blue wavelength region, and passes through 100% any light in a longer wavelength region . . . (2)

As the photocurrent J1ref as a result of reflection of the light Hb in the blue wavelength region by the translucent reflective layer 9b, added is the photocurrent of J1ref=kb·J1·exp(−αtb) . . . (3) Note here that, in consideration of (2), K is Kb=1 (λ<λbg), and Kb=0 (λ>λbg) That is, compared with the conventional structure, through the expression of (3), the larger amount of photocurrent can be derived through absorption in the blue wavelength region.

Such an amount of component does not contribute (mix) to optical-electrical conversion in the lower green photoconductive layer 5g, leading to the better color resolution. That is, with the conventional structure, the optical-electrical conversion in the green photoconductive layer 5g being a middle layer may result in leakage of the light Hb in the blue wavelength region from the upper photoconductive layer 5b. With the structure of the present invention, on the other hand, the light Hb in the blue wavelength region is favorably cut by the translucent reflective layer 9b.

Similarly to the above, thanks to the reflection components of the light Hg in the green wavelength region in the lower translucent reflective layer 9g of the photoconductive layer 5g for green, with the structure of the present invention, the sensitivity can be favorably expected similarly to the above. As such, the blue light Hb and the green light Hg will be the reflection components, and these lights Hb and Hg do not mix into the photoconductive layer 5r at the bottom. As such, in the photoconductive layer 5r, the light Hr in the red wavelength region is mainly used for optical-electrical conversion.

Note that, in the above embodiment, the light absorbing layer 11 is provided below the photoconductive layer 5r for red. When the light Hr in the red wavelength region is relatively weak, as an alternative to the light absorbing layer 11, a reflection layer may be provided for reflecting the light Hr in the red wavelength region. If this is the case, the more light Hr in the red wavelength region can be subjected to optical-electrical conversion by the photoconductive layer 5r, increasing the strength of the light in the red wavelength region. In this case, also by the photoconductive layer 5r located at the bottom, the light reflected by the reflection layer provided therebelow can contribute to the optical-electrical conversion. Accordingly, compared with the conventional structure of FIG. 1, even if the photoconductive layer 5r is reduced in thickness, the sensitivity properties can be easily derived, leading to the expectation of the thinner light receiving section.

Further, the photoconductive layer 5r for red is not necessarily provided with either the light absorbing layer 11 or the reflection layer. If leakage of the light Hr in the red wavelength region to the upper layer causes no harm, there is no need to include such a layer. If this is the case, no translucent reflective layer 7 is provided below the photoconductive layer 5r for red, and a diffusion layer formed on the substrate 1 may be used as an electrode for the lower layer.

In the above embodiment, described is the case of applying the present invention to the CCD solid-state imaging device. This is surely not restrictive, and the solid-state imaging device of the present invention is applicable to a solid-state imaging device of a MOS type (CMOS sensor). If this is the case, as alternatives to the transfer electrode 21 and the charge transfer region therebelow of FIG. 2, wiring connected to the reading gate 19 and a driving circuit may be provided on the surface 1 and the surface layer thereof.

As described in the foregoing, according to the solid-state imaging device of the present invention, in a single-plate color solid-state imaging device of a photoconductive-layer-stacked type, a transparent electrode layer between photoconductive layers is provided with a translucent reflective layer for reflecting any light in a predetermined wavelength region so that any light of a longer wavelength is passed through. As a result, the translucent reflective layer is used to reflect only light in any specific wavelength region out of the light not absorbed by the upper photoconductive layer, and then have the light absorbed again by the upper photoconductive layer. In such a structure, the light in the specific wavelength region is prevented from leaking into the lower photoconductive layer, thereby improving the color resolution and the color productivity. What is more, in the upper photoconductive layer, the reflected light is contributed to optical-electrical conversion so as to improve the quantum efficiency, resultantly improving the sensitivity.

What is claimed is:

1. A solid-state imaging device comprising:
a substrate having a plurality of groups of lamination layers stacked over the substrate, each group of lamination layers comprised of an optical-electrical conversion layer and a pair of transparent electrode layers respectively formed over and below each optical-electrical conversion layer, and
a translucent reflective layer formed between each adjacent group of lamination layers, said translucent reflective layer reflecting light of a predetermined wavelength region and allowing light on a long-wavelength side to pass through, and further wherein a light blocking layer is formed above the substrate between the substrate and a lowest group of the lamination layers and wherein signal transfer structures are formed in the substrate.

2. The solid-state imaging device according to claim 1, wherein at least three groups of lamination layers are provided in the stacked direction,
the optical-electrical conversion layers are reduced in layer thickness from a bottom most group of lamination layers to an upper most group of lamination layers, and
a predetermined wavelength region reflected by the uppermost translucent reflective layer is set shorter than a predetermined wavelength region reflected by the lower-most translucent reflective layer.

3. The solid-state imaging device according to claim 2, wherein between the substrate and a lower-most group of lamination layers, a reflective layer for reflecting the light passed through the plurality of optical-electrical conversion layers is provided; and
wherein the optical-electrical conversion layers located in a middle and at a lowermost group of lamination layers each have a layer thickness sufficient to absorb light entered thereto and reflected by the layer located nearest therebelow.

4. The solid-state imaging device according to claim 1, wherein said capacitor is provided for storing an electric charge accumulated in a corresponding photoconductive layer.

5. The solid-state imaging device according to claim 1, further comprising a CCD structure disposed adjacent said capacitors for read-out of the imaging signals.

6. The solid-state imaging device according to claim 1, wherein each of said capacitors is comprised of an n-type diffusion region and a p-type diffusion region.

7. The solid-state imaging device according to claim 1, wherein the translucent reflective layer formed between each adjacent group of lamination layers is formed directly between an upper transparent electrode of a group of lamination layers formed below the translucent reflective layer and a lower transparent electrode of a group of lamination layers formed above the translucent reflective layer, so as to be in physical contact with both translucent reflective layers.

8. The solid-state imaging device according to claim 1, wherein a first electrode of the pair of electrodes in each group of lamination layers is connected to a shared power supply and a second electrode of the pair of electrodes in each group of lamination layers is connected to a respective corresponding capacitor.

9. The solid-state imaging device according to claim 1, wherein each translucent reflective layer is immediately adjacent a lower electrode of an upper group of lamination layers and an upper electrode of a lower group of lamination layers.

10. The solid-state imaging device according to claim 1, wherein each of the pairs of electrode layers simultaneously transfers a signal from the corresponding optical-electrical conversion layer.

11. A solid-state imaging device, comprising:
a first optical-electrical conversion layer formed above a substrate;
a second optical-electrical conversion layer formed above the first optical-electrical conversion layer; and
a third optical-electrical conversion layer formed above the second optical-electrical conversion layer, wherein
a first pair of translucent electrode layers are respectively formed above and below the first optical-electrical conversion layer such that both are formed below the second optical-electrical conversion layer and above the substrate,
a second pair of translucent electrode layers are respectively formed above and below the second optical-electrical conversion layer such that both are formed above the first optical-electrical conversion layer and below the third optical-electrical conversion layer,
a third pair of translucent electrode layers are respectively formed above and below the third optical-electrical conversion layer such that both are formed above the second optical-electrical conversion layer,
a first translucent reflective layer formed between said second optical-electrical conversion layer and said third optical-electrical conversion layer, which reflects light of a predetermined wavelength region and allows light of a longer-wavelength than said predetermined wavelength to pass through, and a second translucent reflective layer formed between said first optical-electrical conversion layer and said second optical-electrical conversion layer, which reflects light of a predetermined wavelength region and allows light of a longer-wavelength than said predetermined wavelength to pass through, and further wherein a light blocking layer is formed above the substrate between the substrate and the first pair of translucent electrode layers and the first optical-electrical conversion layer and wherein signal transfer structures are formed in the substrate.

12. The solid-state imaging device according to claim 11, wherein signals from the first, second, and third optical-electrical conversion layers are processed, and
a color signal is generated for a pixel in an imaging region.

13. The solid-state imaging device according to claim 11, wherein between the substrate and a first optical-electrical conversion layer, a reflective layer for reflecting a light passed through the plurality of photoconductive layers is provided.

14. The solid-state imaging device according to claim 11, wherein between the substrate and a first optical-electrical conversion layer, a light absorbing layer for absorbing a light passed through the plurality of photoconductive layers is provided.

15. The solid-state imaging device according to claim 11, further comprising a CCD structure disposed adjacent said capacitors for read-out of the imaging signals.

16. The solid-state imaging device according to claim 11, wherein each of said capacitors is comprised of an n-type diffusion region and a p-type diffusion region.

17. The solid-state imaging device according to claim 11, wherein the first translucent reflective layer formed is formed directly between an upper transparent electrode formed over the second optical-electrical conversion layer and a lower transparent electrode formed below the third optical-electrical conversion layer, so as to be in physical contact with both translucent reflective layers.

18. The solid-state imaging device according to claim 17, wherein the second translucent reflective layer formed is formed directly between an upper transparent electrode formed over the first optical-electrical conversion layer and a lower transparent electrode formed below the second optical-electrical conversion layer, so as to be in physical contact with both translucent reflective layers.

19. The solid-state imaging device according to claim 11, wherein a first electrode of each of the first through third pairs of electrodes is connected to a shared power supply, and a second electrode of each of the first through third pairs of electrodes is connected to a respective corresponding capacitor.

20. The solid-state imaging device according to claim 11, wherein each of the pairs of electrode layers simultaneously transfers a signal from the corresponding optical-electrical conversion layer.

* * * * *